(12) United States Patent
Balteanu

(10) Patent No.: US 6,438,365 B1
(45) Date of Patent: Aug. 20, 2002

(54) BALANCED MIXER WITH FEEDBACK PRE-AMPLIFIER

(75) Inventor: Florinel Balteanu, Ottawa (CA)

(73) Assignee: Philsar Semiconductor Inc., Nepean (CA)

(*) Notice: Subject to any disclaimer, the term of this patent is extended or adjusted under 35 U.S.C. 154(b) by 0 days.

(21) Appl. No.: 09/088,745

(22) Filed: Jun. 2, 1998

(51) Int. Cl.[7] .............................. H04B 1/26; G06F 7/44
(52) U.S. Cl. ........................ 455/326; 455/323; 327/359
(58) Field of Search .................. 455/326, 305, 455/63, 327, 295, 296, 328, 333; 327/113, 358, 359, 361, 266

(56) References Cited

U.S. PATENT DOCUMENTS

| | | | | |
|---|---|---|---|---|
| 4,931,799 A | * | 6/1990 | Wen et al. ................ | 342/110 |
| 5,161,254 A | * | 11/1992 | Braathen ................... | 455/306 |
| 5,204,983 A | * | 4/1993 | Jones ........................ | 455/315 |
| 5,507,036 A | * | 4/1996 | Vagher ...................... | 455/295 |
| 5,548,840 A | * | 8/1996 | Heck ......................... | 455/326 |
| 5,589,791 A | * | 12/1996 | Gilbert ...................... | 327/359 |
| 5,613,233 A | * | 3/1997 | Vagher ...................... | 455/296 |
| 5,630,228 A | * | 5/1997 | Mittel ........................ | 455/326 |
| 5,884,154 A | * | 3/1999 | Sano et al. ................. | 455/333 |
| 5,886,547 A | * | 3/1999 | Durec et al. ............... | 327/113 |
| 5,945,878 A | * | 8/1999 | Westwick et al. .......... | 330/301 |
| 5,953,659 A | * | 9/1999 | Kotzin et al. .............. | 455/422 |
| 5,966,645 A | * | 10/1999 | Davis ........................ | 455/108 |
| 5,974,301 A | * | 10/1999 | Palmer et al. ............. | 455/63 |

OTHER PUBLICATIONS

Trask, Chris, "Feedback technique improves active mixer performance", RF Design Engineering Principles and Practices, Sep. 1997.

Morin, Marc A., "A 1.6 Gb/s Delta–Sigma Modulator with-integrated Wideband Mixer for RF Applications", Proceedings of the 1998 Bipolar/BiCMOS Circuits and Technology Meeting, Sep. 27–29, 1998, Minneapolis, Minnesota, pp. 148–151.

* cited by examiner

Primary Examiner—Reinhard J. Eisenzopf
Assistant Examiner—Charles N. Appiah
(74) Attorney, Agent, or Firm—Harold C. Baker; Robert A. Wilkes; Robert G. Hendry

(57) ABSTRACT

An improved balanced mixer is provided for use in radio communication devices. The improved balanced mixer comprises a known Gilbert type mixer, a transconductance amplifier, a signal splitter, and a dual feedback structure from the pre-amplifier output to the input ports, thereby providing better linearity, that is, better input third order intercept point (IIP3), and improved impedance matching, without increasing the circuit noise figure.

12 Claims, 5 Drawing Sheets

US 6,438,365 B1

BALANCED MIXER WITH FEEDBACK PRE-AMPLIFIER

FIELD OF THE INVENTION

The present invention generally relates to radio communication devices and systems and specifically to mixers in radio communications devices.

BACKGROUND OF THE INVENTION

Balanced mixers are used in radio receivers for transforming incoming radio frequency (RF), containing numerous frequency signals, to an intermediate frequency (IF). A mixer is a non-linear device that receives two signals, one from an (RF) antenna that is amplified by a Low Noise Amplifier (LNA), and the other from an internal local oscillator (Lo), and produces a third output signal. The resulting output signal can be demodulated using a variety of demodulation schemes and presented to a user. Since the output signal is a host of sum and difference terms, the mixer can be used to step up the frequency of the input RF signal.

Balanced mixers have been used extensively, together with other configurations, in various radio systems.

Monolithic double balanced mixers are generally based on structures known as Gilbert cell, first described by Gilbert in 1969. Although the Gilbert type mixer has excellent carrier suppression and low second order distortion, it suffers from a high noise figure and intermodulation distortion.

FIG. 1 presents a typical structure for a Gilbert cell mixer known in the prior art. The mixer core includes four transistors Q1, Q2, Q3, and Q4 that are coupled to differential local oscillator inputs Lo+ and Lo−. The RF signal is present at the inputs RF+ and RF− as a differential (balanced) signal and is coupled to the mixer core using transistors Q5 and Q6. The RF signal is amplified and converted from voltage to current by transistor pair Q5 and Q6 and is switched by the mixer core at the rate of the local oscillator. The switched current produces an intermediate frequency signal IF, at the outputs Out− and Out+, having a frequency described by the following equation:

Frequency (IF)=Frequency (Lo)−Frequency (RF)

The resistors Rc1 and Rc2 are used for converting current information into voltage information. A degeneration resistor Re couples the emitters of transistors Q5 and Q6 to the current sources Io1 and Io2. Degeneration resistor Re improves the input third order intercept point (IIP3) for the incoming RF signals. However, increasing the value of degeneration resistor Re will degrade the noise figure and the mixer gain. Input impedance, provided by the input differential transistor pair Q5 and Q6 with emitter degeneration, will be high due to series feedback, and will require additional circuitry for input impedance matching.

SUMMARY OF THE INVENTION

In view of the foregoing, it is an object of the present invention to provide a balanced mixer which obviates and mitigates from the disadvantages of the prior art and improves the overall performance of the mixer circuit input third order intercept point (IIP3), noise figure, and input impedance matching ability.

According to the present invention, there is provided a balanced mixer comprising: a first differential input port to provide input radio frequency to the balanced mixer; a second differential input port to provide local oscillator frequency to the balanced mixer; a transconductance amplifier means connected to the first input port; a splitter circuit means connected to the amplifier means for splitting the input radio frequency; a mixer means connected to the splitter means and to the second input port for receiving the split input radio frequency and the local oscillator frequency; a feedback means connected between the splitter means and the first input port to provide feedback current to the first input port; and an output port connected to the mixer means.

One advantage of the present invention is that the feedback means improves the overall performance of the mixer circuit input third order intercept point (IIP3), noise figure, and input impedance matching ability.

Other advantages, objects and features of the present invention will be readily apparent to those skilled in the art from a review of the following detailed descriptions of a preferred embodiment in conjunction with the accompanying drawings and claims.

BRIEF DESCRIPTION OF THE DRAWINGS

Preferred embodiments of the present invention will now be described in greater detail and will be better understood when read in conjunction with the following drawings in which.

Similar references are used in different figures to denote similar components.

DETAILED DESCRIPTION OF THE INVENTION

Figure 1:
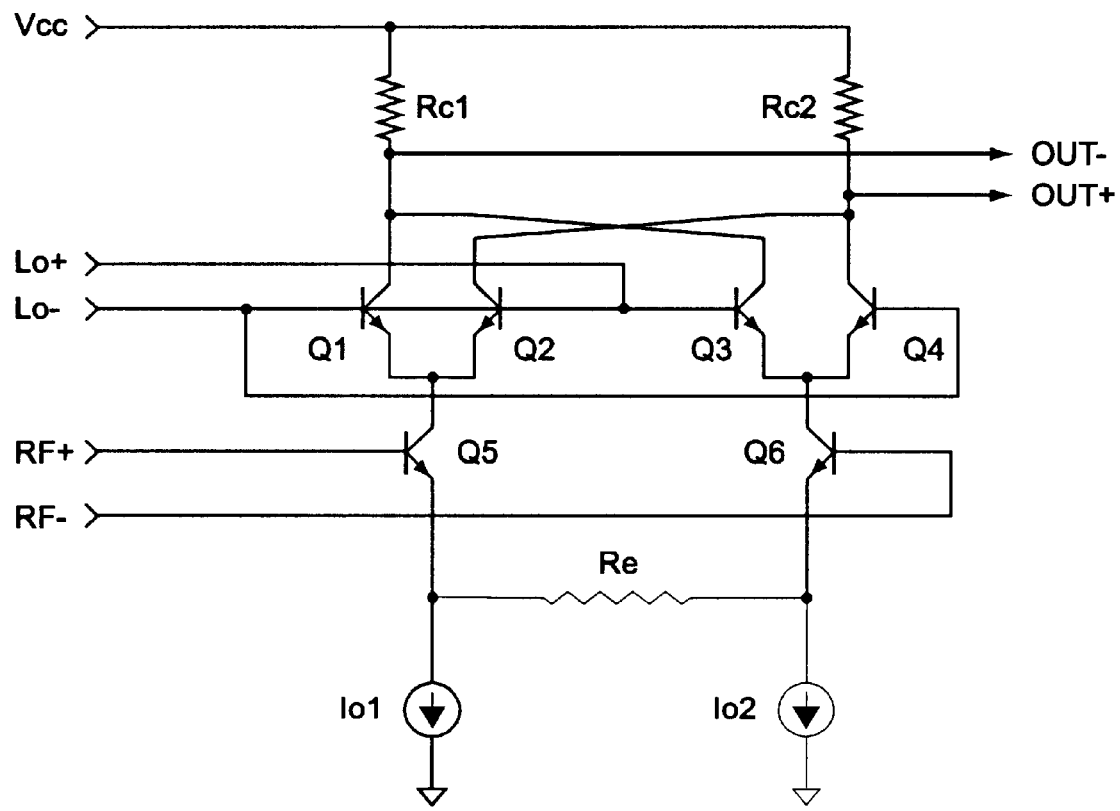
FIG. 1 is a schematic diagram of a prior art Gilbert cell mixer.
Figure 2:
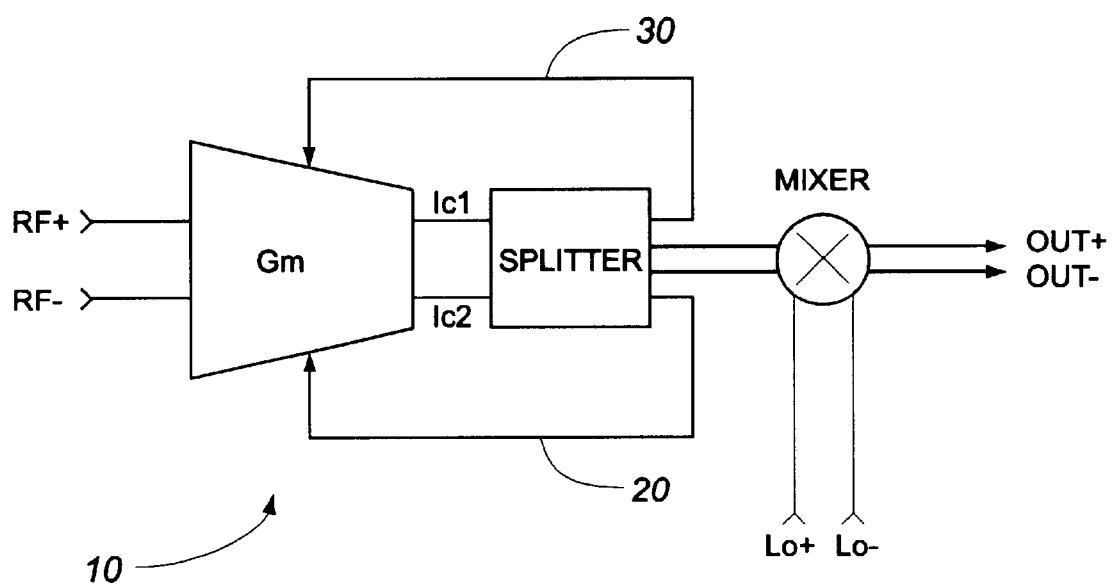
FIG. 2 is a block diagram of a balanced mixer in accordance with one embodiment of the present invention.

FIG. 2 is a block diagram of a preferred embodiment of the balanced mixer circuit 10 of the present invention. Balanced mixer 10 is comprised of a transconductance amplifier Gm, a current Splitter, a Gilbert type Mixer core, and feedback structures 20 and 30. Balanced mixer 10, as shown in FIG. 2, includes a balanced pair of RF inputs, RF+ and RF−, a balanced pair of local oscillator inputs, Lo+ and Lo−, and a balanced pair of outputs, Out+ and Out−. RF inputs, RF+ and RF−, are coupled to the current Splitter through transconductance amplifier Gm. Transconductance amplifier Gm converts the voltage RF signal from RF inputs, RF+ and RF−, into current Ic1 and Ic2 and provides this current to the Splitter. The Splitter produces four output current signals from the two incoming current signals. Two of the Splitter outputs are used for the Mixer core and the other two are used for the first feedback structure 20. This arrangement serves to increase the input third order intercept point (IIP3) of balanced mixer 10 without increasing the circuit noise figure. An output signal is provided at output ports Out+ and Out−.

Figure 3:
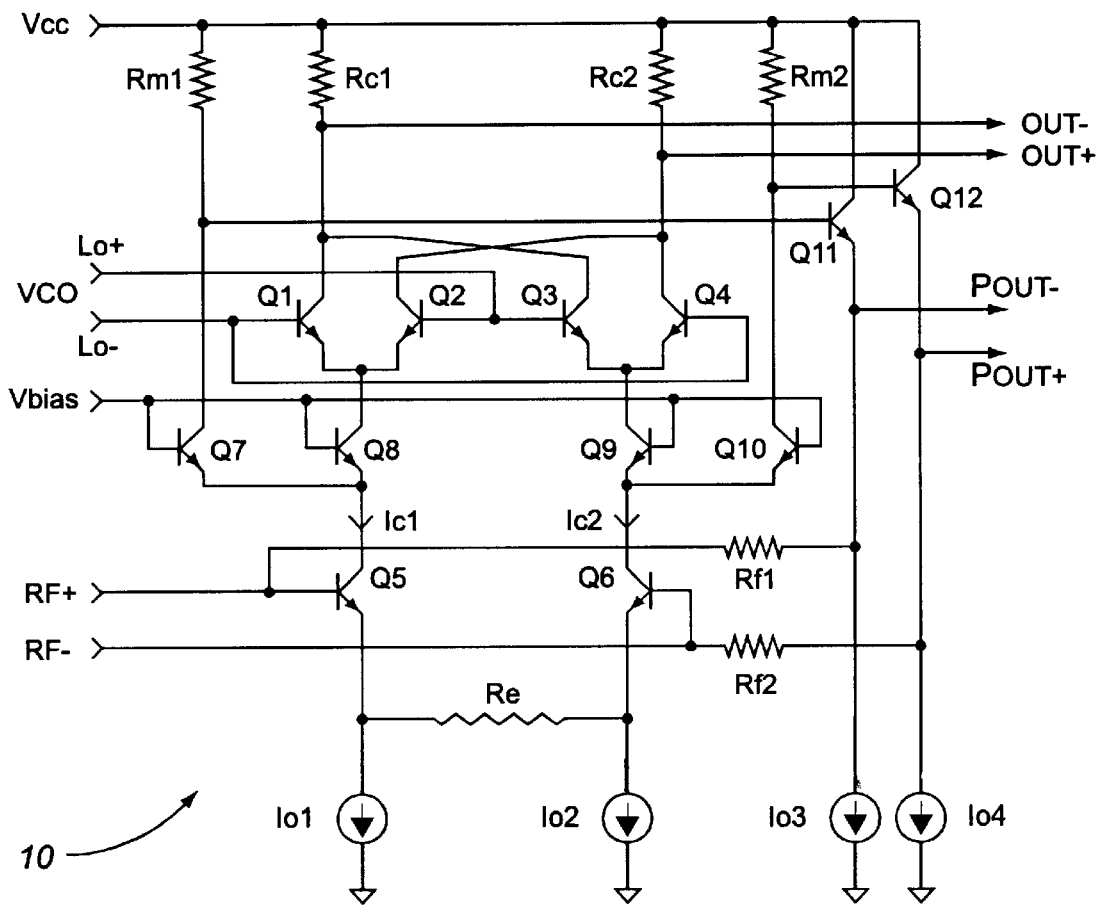
FIG. 3 is a schematic diagram showing a practical balanced mixer implementation in accordance with one embodiment of the present invention.

FIG. 3 is a schematic diagram of balanced mixer circuit 10 in accordance with one embodiment of the present invention. The Mixer core is a Gilbert cell which includes transistors Q1, Q2, Q3, and Q4 that feed the output resistors Rc1 and Rc2. Local oscillator input Lo+ is connected to the Mixer core through the bases of transistors Q2 and Q3 and local oscillator input Lo− is connected to the Mixer core through the bases of transistors Q1 and Q4. The collectors of transistors Q1 and Q3, and Q2 and Q4 transfer current into the output resistors Rc1 and Rc2 respectively. The collectors of transistors Q1 and Q3 are connected to form the first RF output Out− and the collectors of transistors Q2 and Q4 are connected to form the second RF output Out+. The output port formed by Out+ and Out− provides the intermediate frequency signal (IF) for demodulation in the next stages. A power supply Vcc provides current for balance mixer 10.

RF input signal RF+ is coupled to the base of transistor Q5 and RF input signal RF− is coupled to the base of transistor Q6. A current source Io1 is connected to the emitter of transistor Q5 and a current source Io2 is connected to the emitter of transistor Q6. A degeneration resistor Re is connected between the emitters of transistors Q5 and Q6 and forms the gain of balanced mixer 10 and the second feedback structure 30. Transistors Q5, and Q6, resistor Re, and current source Io1 and Io2, comprise the transconductance amplifier Gm, as shown in the block diagram of FIG. 2.

The RF signal is converted to current by transconductance amplifier Gm and applied to the Splitter formed by the transistors Q7, Q8, Q9 and Q10. Voltage Vbias provides base bias for the Splitter. Transistor pairs Q7 and Q8, and Q9 and Q10 of the Splitter have the same base emitter voltage and therefore the two collector currents of transistors Q5 and Q6 are halved. One half of the collector current Ic1 of transistor Q5 is driven by transistor Q7 into resistor Rm1 and the other half of the collector current Ic1 of transistor Q5 is driven by transistor Q8 into the Mixer core transistors Q1 and Q2. One half of the collector current Ic2 of transistor Q6 is driven by transistor Q10 into resistor Rm2 and the other half of the collector current Ic2 of transistor Q6 is driven by Q9 into the Mixer core transistors Q3 and Q4.

The voltages from resistors Rm1 and Rm2 are transferred by the two emitter followers of the transistors Q11 and Q12 into the output pre-amplifier signal, Pout− and Pout+. The emitter followers of transistors Q11 and Q12 are biassed by the current sources Io3 and Io4. The output port Pout+ and Pout− provides the output pre-amplified RF signal and also feeds back this signal into the RF input port RF+ and RF− through the resistors Rf1 and Rf2. This provides balanced mixer 10 with feedback 20 which improves the linearity of the stage for the RF signal and adjusts the input impedance. The improved linearity results in a higher input third order intercept point (IIP3) without increasing the degeneration resistor Re, thus providing balanced mixer 10 with a lower noise figure compared to that found in the prior art.

Figure 4:
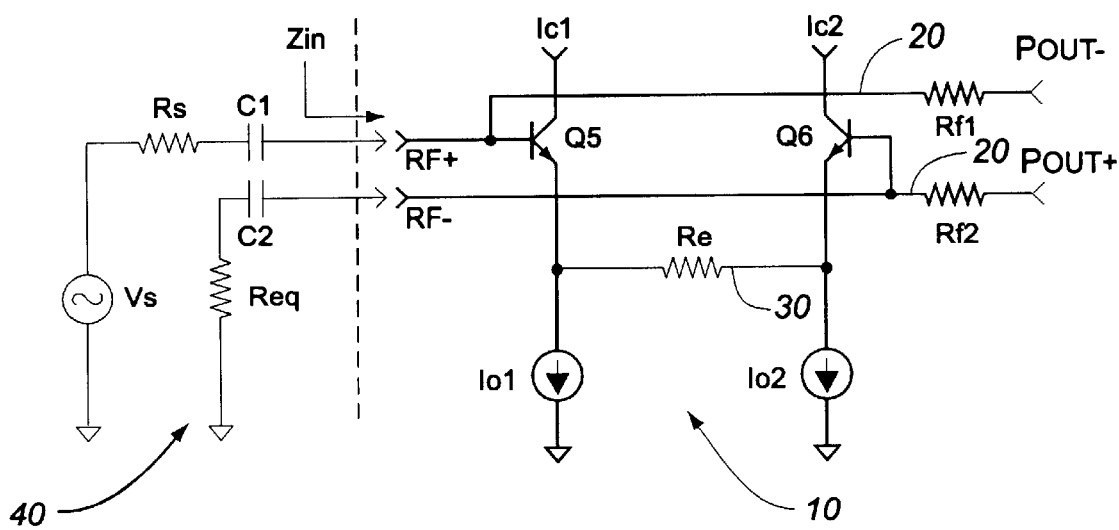
FIG. 4 is a schematic diagram showing a single ended RF signal source coupled to the present invention.

FIG. 4 is a schematic diagram showing a single ended RF signal source 40 coupled to balanced mixer 10. The RF signal is provided by the source Vs having a resistor Rs as internal impedance and is A–C coupled through a capacitor C1 to balanced mixer 10. Another resistor Req (which is approximately equal to resistor Rs), and a capacitor C2 are provided to compensate the balanced structure of balanced mixer 10 with the single ended structure of the RF incoming signal. The RF input port of balanced mixer 10 is shown at RF+ and RF−. Transistors Q5 and Q6 form the differential input structure that transforms the input voltage signal into collector currents Ic1 and Ic2 in transconductance amplifier structure Gm (see FIG. 2). The current sources Io1 and Io2 provide the emitter currents for transistors Q5 and Q6. The differential input structure has two feedback paths 20 and 30. The second feedback path 30 is provided by degeneration resistor Re and increases the input third order intercept point (IIP3). The first path 20 is provided by resistors Rf1 and Rf2 which feedback the output pre-amplifier signal present at the output port Pout− and Pout+. The first feedback path 20 also provides the necessary base current for transistors Q5 and Q6, lowers the input impedance Zin (which should preferably be approximately equal to resister Rs), and improves the overall linearity of the stage.

In summary, the balanced mixer circuit 10 has two feedback paths 20 and 30 to the input port that combine to improve the performances of the input third order intercept point (IIP3), lower the circuit noise compared to that found in the prior art (due to the low value of degeneration resistor Re), and match the input impedance without increasing the noise figure.

Figure 5:
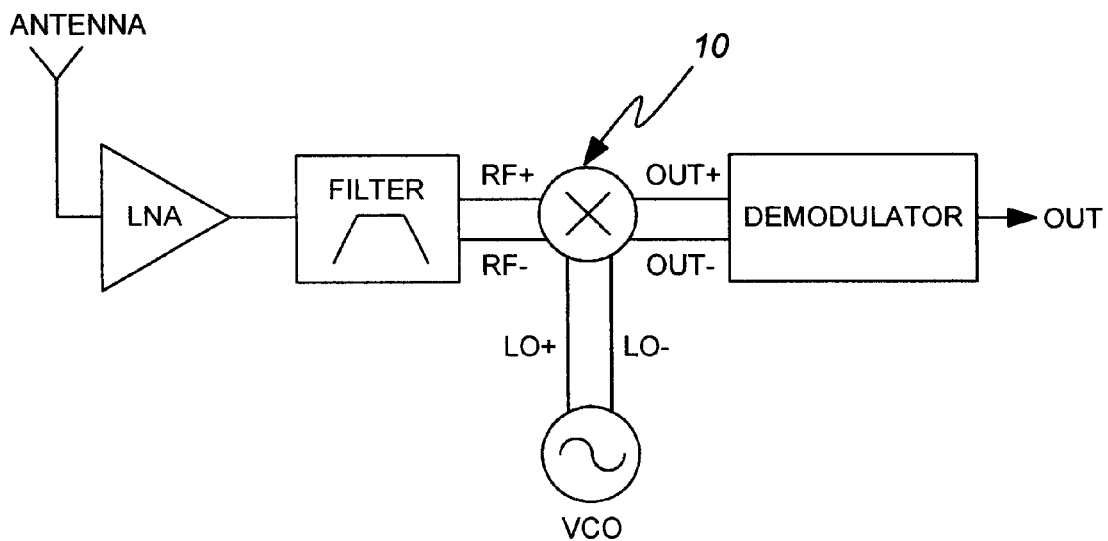
FIG. 5 is a block diagram showing one possible communication system in accordance with the present invention.

FIG. 5 is a block diagram showing a possible communication system in accordance with the present invention. In the embodiment shown, the RF signals are received by an Antenna and amplified by a low noise amplifier LNA. A Filter connected to the LNA removes undesired signals and provides the necessary RF signal for balanced mixer 10. Balanced mixer 10 takes the signal from the Filter (RF+, RF−) and combines it with the signal coming from a local voltage controlled oscillator VCO (Lo+, Lo−). The resulting output signal (Out+, Out−) provided by balanced mixer 10, feeds the Demodulator that decodes and presents the signal Out to the user.

The applicant has found that the use of a dual feedback path as herein described provides better linearity, that is, a better input third order intercept point (IIP3), and better impedance matching, without increasing the circuit noise figure.

It is understood that the above described embodiments of the present invention are intended to be illustrative of preferred embodiments of the present invention and are not intended to limit the scope of the present invention. Various modifications of the circuits shown and described, that would be readily apparent to one skilled in the art, are intended to be within the scope and spirit of the present invention. The only limitations to the scope of the present invention are set out in the following appended claims.

I claim:

1. A balanced mixer circuit comprising:
   a first differential input port for providing an input radio frequency to the balanced mixer circuit;
   a second differential input port for providing a local oscillator frequency to the balanced mixer circuit;
   a transconductance amplifier means for receiving and converting the input radio frequency into a collector current, said transconductance amplifier means being coupled to the first input port;
   a splitter circuit means for splitting the collector current, said splitter means being coupled to the transconductance amplifier means;
   a mixer means for receiving a first portion of a split output of the splitter circuit means and the local oscillator frequency, said mixer means being coupled to the splitter circuit means and the second differential input port;
   a first feedback means for providing a first feedback current to the first input port, said first feedback means coupled between a second portion of the split output of the splitter circuit means and the first input port;
   a second feedback means for providing a second feedback current to the first input port, said second feedback means being coupled to the transconductance amplifier means; and an output port coupled to the mixer means.

2. The balanced mixer of claim 1, further comprising a single ended RF input source for providing RF input to the first differential input port.

3. A mixer circuit as claimed in claim 1 wherein the input radio frequency is a balanced pair of radio frequency inputs.

4. A mixer circuit as claimed in claim 3 wherein the transconductance amplifier means is a pair of transistors, each of the pair of transistors receiving at its base one of the balanced pair of radio frequency inputs and converting said one of the balanced pair of radio frequency inputs into a collector current for transmission to the splitter circuit means.

5. A mixer circuit as claimed in claim 4 wherein the splitter circuit means comprises two pairs of transistors, each pair of the two pairs of transistors having the same base emitter voltage and receiving a collector current from the transconductance amplifier means, each transistor of the two pairs of transistors receiving one half of the collector current.

6. A mixer circuit as claimed in claim 4 wherein the local oscillator frequency is a balanced pair of local oscillator inputs.

7. A mixer circuit as claimed in claim 6 wherein the mixer means is a Gilbert cell having two pairs of transistors, each pair of transistors receiving half of the collector current at its emitters and receiving the local oscillator inputs at their bases.

8. A mixer circuit as claimed in claim 7 further including a pair of output resistors, each of said pair of output resistors coupling the gilbert cell to the output port.

9. A mixer circuit as claimed in claim 5 wherein the first feedback means is a pair of emitter followers of a first pair of transistors, each emitter follower being coupled to a resistance coupled to a transistor of the two pairs of transistors receiving one half of the collector current.

10. A mixer circuit as claimed in claim 9 wherein the first feedback means further includes a second pair of resistances, each of said second pair of resistances being coupled between an emitter follower and one of the balanced pair of radio frequency inputs.

11. A mixer circuit as claimed in claim 4 wherein the second feedback means is a degeneration resistor coupled between emitters of the pair of transistors comprising the transconductance amplifier means.

12. A balanced mixer circuit comprising:
    a transconductance amplifier receiving an input radio frequency and converting said input radio frequency into a collector current;
    a splitter circuit coupled to receive the collector current and to split the collector current into a feedback current and a mixer current;
    a mixer core coupled to receive a local oscillator frequency and the mixer current, said mixer core outputting an intermediate frequency signal;
    a first feedback path coupled between the splitter circuit and the transconductance amplifier, said first feedback path being used by the feedback current to provide a feedback to the input radio frequency;
    a second feedback path coupled between the splitter and the transconductance amplifier such that the transconductance amplifier is coupled between the first and the second feedback paths.

\* \* \* \* \*